(12) United States Patent
Mori (10) Patent No.: US 7,307,435 B2
(45) Date of Patent: Dec. 11, 2007

(54) PROBE CARD

(75) Inventor: Chikaomi Mori, Yamaga (JP)

(73) Assignee: Nihon Denshizairyo Kabushiki Kaisha, Amagasaki-shi (JP)

( * ) Notice: Subject to any disclaimer, the term of this patent is extended or adjusted under 35 U.S.C. 154(b) by 0 days.

(21) Appl. No.: 11/229,843

(22) Filed: Sep. 20, 2005

(65) Prior Publication Data

US 2006/0061375 A1    Mar. 23, 2006

Related U.S. Application Data

(63) Continuation-in-part of application No. 10/622,464, filed on Jul. 21, 2003, now Pat. No. 7,075,319.

(30) Foreign Application Priority Data

Aug. 9, 2002  (JP) .............................. 2002-233979

(51) Int. Cl.
*G01R 31/02* (2006.01)
(52) U.S. Cl. ..................................................... 324/754
(58) Field of Classification Search .................... None
See application file for complete search history.

(56) References Cited

U.S. PATENT DOCUMENTS

| | | | |
|---|---|---|---|
| 4,987,365 A | 1/1991 | Shreeve et al. | 324/158 |
| 5,506,498 A | 4/1996 | Anderson et al. | 324/158.1 |
| 5,559,446 A * | 9/1996 | Sano | 324/760 |
| 5,825,192 A | 10/1998 | Hagihara | 324/757 |
| 5,850,148 A | 12/1998 | Nam | 324/761 |
| 5,905,382 A | 5/1999 | Wood et al. | 324/758 |
| 5,982,183 A * | 11/1999 | Sano | 324/754 |
| 6,078,186 A | 6/2000 | Hembree et al. | 324/755 |
| 6,130,543 A | 10/2000 | Iino | 324/754 |
| 6,340,604 B1 | 1/2002 | Tsuura | 438/15 |

(Continued)

FOREIGN PATENT DOCUMENTS

JP    07-066249    3/1995

(Continued)

OTHER PUBLICATIONS

European Search Report dated Sep. 26, 2005; 2 pages (double-sided).

*Primary Examiner*—Jermele Hollington
(74) *Attorney, Agent, or Firm*—Kratz, Quintos & Hanson, LLP (57) ABSTRACT

A probe card includes a main substrate, a main reinforcing plate attached to the upper surface of the main substrate, a sub-reinforcing plate attached to the upper surface of the main reinforcing plate, and coupling force adjusting means that couples the main reinforcing plate with the sub-reinforcing plate and adjusts the coupling force therebetween. The coupling force adjusting means has a plurality of threaded holes provided at intersections of a plurality of imaginary concentric circles, which is provided with a distance from a center of a probe card on a surface of the sub-reinforcing plate, and a plurality of imaginary straight lines, which is provided radially from the center at an predetermined angle; a plurality of screw holes provided at same intersections on a surface of the main reinforcing plate; and a plurality of coupling screws threaded selectively into the threaded holes 23a and the screw holes.

5 Claims, 10 Drawing Sheets

U.S. PATENT DOCUMENTS

| | | | |
|---|---|---|---|
| 6,509,751 B1 | 1/2003 | Mathieu et al. | 324/754 |
| 6,563,330 B1 | 5/2003 | Maruyama et al. | 324/754 |
| 6,566,150 B2 | 5/2003 | Kohno et al. | 438/14 |
| 6,640,415 B2 | 11/2003 | Eslamy et al. | 29/593 |
| 6,661,247 B2 | 12/2003 | Maruyama et al. | 324/765 |
| 6,737,882 B2 | 5/2004 | Wood et al. | 324/765 |
| 2004/0257098 A1* | 12/2004 | Satou et al. | 324/754 |

FOREIGN PATENT DOCUMENTS

| | | | |
|---|---|---|---|
| JP | 10038924 A * | 2/1998 | |
| JP | 2000241454 A * | 9/2000 | |
| WO | WO 00/33096 | 6/2000 | |
| WO | WO 00/45433 | 8/2000 | |
| WO | WO 01/01247 A2 | 1/2001 | |
| WO | WO 01/01247 A3 | 1/2001 | |
| WO | WO 01/71779 A2 | 9/2001 | |
| WO | WO 01/71779 A3 | 9/2001 | |
| WO | WO 02/061442 | 8/2002 | |

\* cited by examiner

PRIOR ART

PROBE CARD

This application is a continuation-in-parts of application Ser. No. 10/622,464 filed on Jul. 21, 2003, now U.S. Pat. No. 7,075,319.

BACKGROUND OF THE INVENTION

1. Field of the Invention

The present invention relates to a probe card measuring electric characteristics of a semiconductor device (measurement objective) such as an LSI chip.

2. Description of the Related Art

Figure 11:
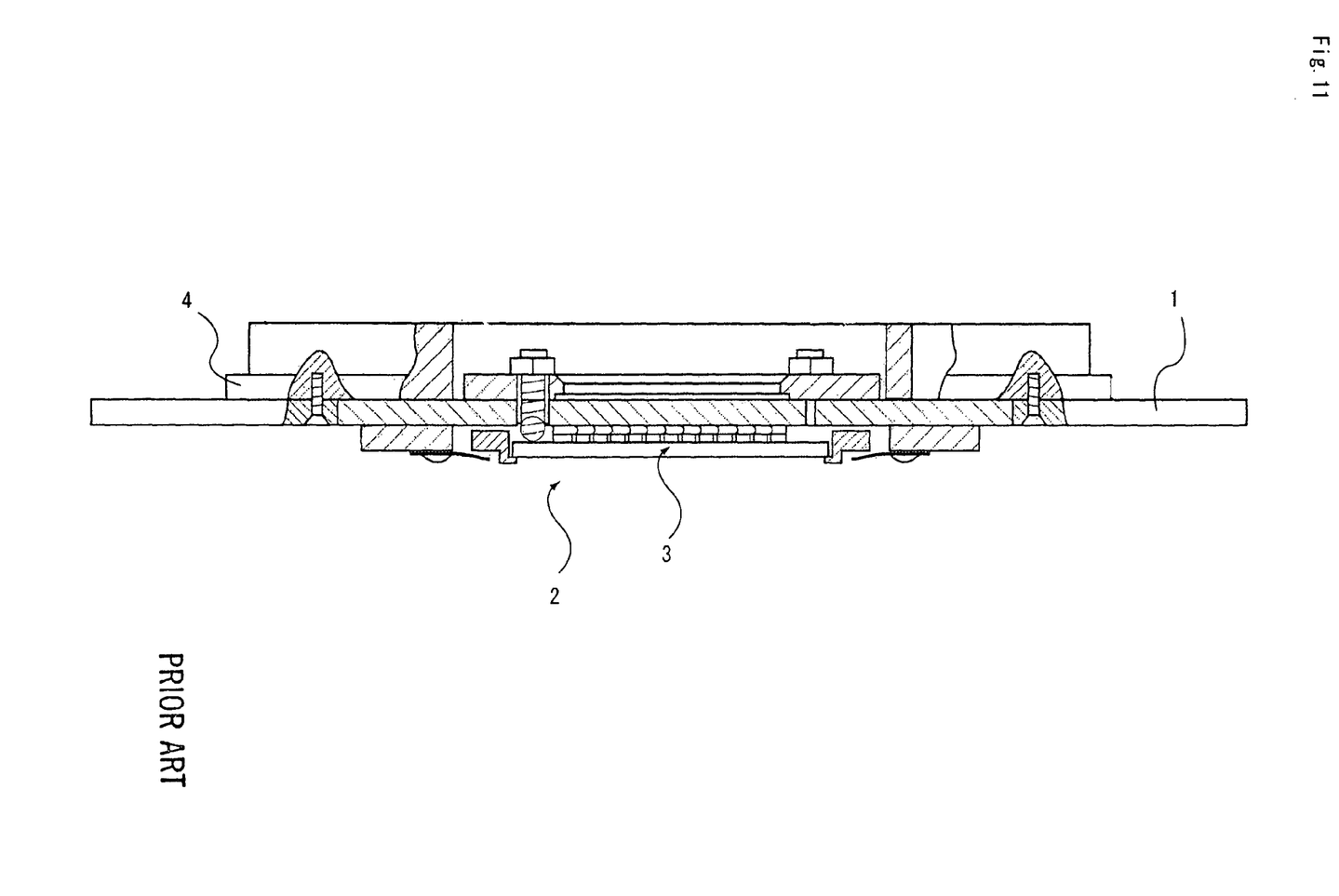
FIG. 11 is a side view, partially broken away, of a conventional probe card.

As shown in FIG. 11, a typical conventional probe card basically has a main substrate 1 having an electrode, on an upper surface thereof, connected to an electrode of a measuring instrument, a probe unit 2 arranged so as to be opposite to a lower surface of the main substrate 1 and having a plurality of probes, a contact pin 3 interposed between the main substrate 1 and the probe unit 2 and electrically connecting both, and a reinforcing plate 4 attached to the upper surface of the main substrate 1.

When this probe card is used at high temperature or low temperature, the temperature distribution of the main substrate 1, and the reinforcing plate 4 of the probe card is changed to cause thermal expansion or thermal shrinkage. In other words, the probe card is deformed (warped). The plane of the probe card A is distorted. The deformation due to heat is caused by fixing a plurality of planar members having different thermal expansion coefficients in a face-to-face contact state. In the case of this probe card, the deformation due to heat is caused by the fixed relation between the main substrate 1, and the reinforcing plate 4.

When the probe card is deformed in this way, variations in the height of the probes occur. When using the probe card in such a state to measure a measurement objective, while some probes are brought into contact with some electrodes of the measurement objective, the remaining probes are not brought into contact with the remaining electrodes of the measurement objective. Thus, there is a problem that the probe card A cannot stably measure electric characteristics of a measurement objective in an environment at high temperature or low temperature.

SUMMARY OF THE INVENTION

The present invention has been originally conceived to solve the above problems and it is an object of the present invention to provide a probe card capable of preventing deformation due to thermal expansion or thermal shrinkage of a main substrate and reinforcing plates.

In order to achieve the above object, a first probe card of the present invention is configured to include a main substrate, a main reinforcing plate attached to the main substrate; and a sub-reinforcing plate attached to the main reinforcing plate, the prove card having a coupling force adjusting means capable of coupling the main reinforcing plate with the sub-reforcing plate at a plurality of coupling positions that are intersections of a plurality of imaginary concentric circles provided with a distance from a center of the probe card, and a plurality of imaginary straight lines provided radially from the center at an predetermined angle, the coupling force adjusting means capable of selectively setting the plurality of coupling positions.

In the probe card of this kind, the coupling force adjusting means selectively adjusts a plurality of coupling positions as the intersections of a plurality of imaginary concentric circles provided to be spaced from the center of the probe card and a plurality of imaginary straight lines provided radially from the center at each predetermined angle, thereby adjusting the coupling force of the main reinforcing plate and the sub-reinforcing plate. Deformation of the main substrate, the main reinforcing plate, and the sub-reinforcing plate due to the difference in the amount of thermal expansion or thermal shrinkage can be prevented. As a result, the probe card can bring all probes into contact with electrodes of a measurement objective in an environment at high temperature or low temperature. Electric characteristics of the measurement objective can be stably measured.

The coupling force adjusting means is provided with a plurality of screw holes of the main reinforcing plate provided at the plurality of coupling positions, a plurality of threaded holes of the sub-reinforcing plate provided at the plurality of coupling positions, and a plurality of coupling screws threaded into the respective screw holes and threaded holes. The threaded positions of the coupling screws into the threaded holes and screw holes and/or the number of coupling screws to be threaded may be changed, thereby adjusting the coupling force of the main reinforcing plate and the sub-reinforcing plate. With this, deformation of the main substrate, the main reinforcing plate, and the sub-reinforcing plate due to thermal expansion or thermal shrinkage can be prevented. It is possible to prevent deformation of the main substrate, the main reinforcing plate, and the sub-reinforcing plate by a simple construction, and there is a merit in cost reduction.

It is preferable that the coupling screw is a countersunk screw whose outer circumferential surface of a head portion is a tapered surface. When using a countersunk screw as a coupling screw, because the outer circumferential surface of the head portion of the flat head screw is a tapered surface, deformation of the sub-reinforcing plate due to thermal expansion or thermal shrinkage in an X-Y direction can be easily prevented. Thus, it is easier to control deformation of the main substrate, the main reinforcing plate, and the sub-reinforcing plate.

A second probe card of the present invention is configured to include a main substrate, a main reinforcing plate attached to the main substrate; and a sub-reforcing plate attached to the main reinforcing plate, wherein each of the main substrate, the main reinforcing plate, and the sub-reforcing plate is made of a material having a thermal expansion coefficient at which warping caused in coupling the main substrate with the main reinforcing plate and warping caused in coupling the main reinforcing plate with the sub-reforcing plate cancel each other.

In the second probe card of this kind, the main substrate, the main reinforcing plate, and the sub reinforcing plate each are made of a material having the above-described thermal expansion coefficient. A warp caused in the main substrate and the main reinforcing plate by a bimetal effect and a warp caused in the main reinforcing plate and the sub-reinforcing plate by a bimetal effect cancel each other out, thereby preventing deformation of the main substrate, the main reinforcing plate, and the sub-reinforcing plate due to the difference in the amount of thermal expansion or thermal shrinkage. As a result, the probe card can bring all probes into contact with electrodes of a measurement objective in an environment at high temperature or low temperature. Electric characteristics of the measurement objective can be stably measured.

BRIEF DESCRIPTION OF THE DRAWINGS

FIGS. 6A and 6B are views showing a probe card related to a second embodiment of the present invention, wherein

EXPLANATION OF THE REFERENCE NUMERALS

A, B: probe cards
10: main substrate
21: main reinforcing plate
22: sub-reinforcing plate
23: coupling force adjusting means
23*a*: threaded hole
23*b*: screwed hole
23*c*: coupling screw
23*c*1: tapered surface
α: imaginary concentric circle
β: imaginary straight line

DETAILED DESCRIPTION OF THE INVENTION

Figure 1:
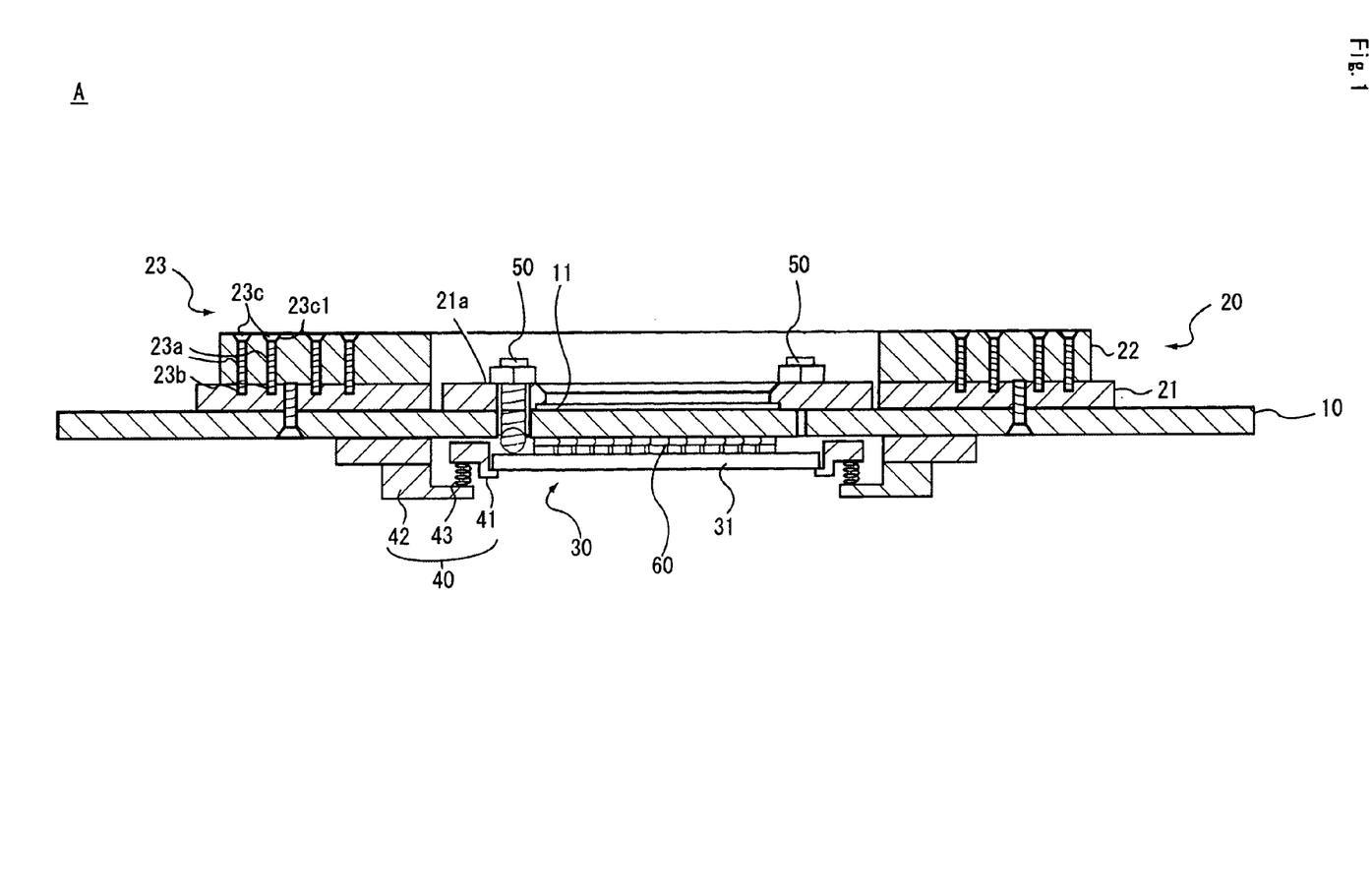
FIG. 1 is a schematic sectional view of a probe card related to a first embodiment of the present invention.
Figure 2:
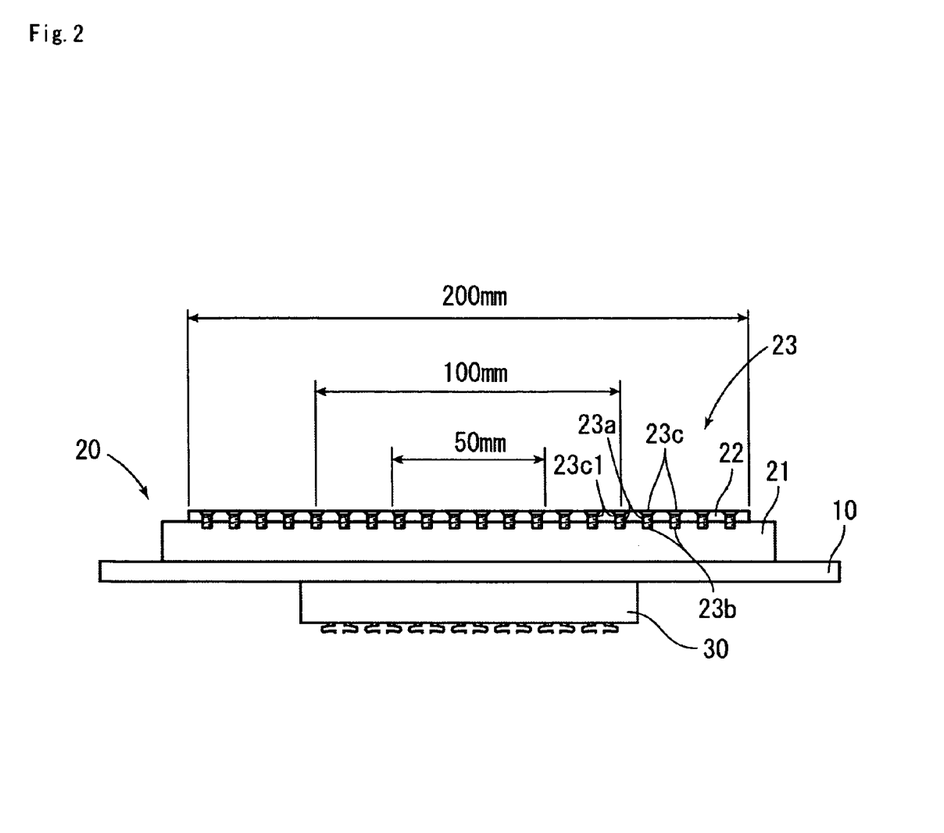
FIG. 2 is a schematic sectional view of a test probe card related to the first embodiment of the present invention.
Figure 3:
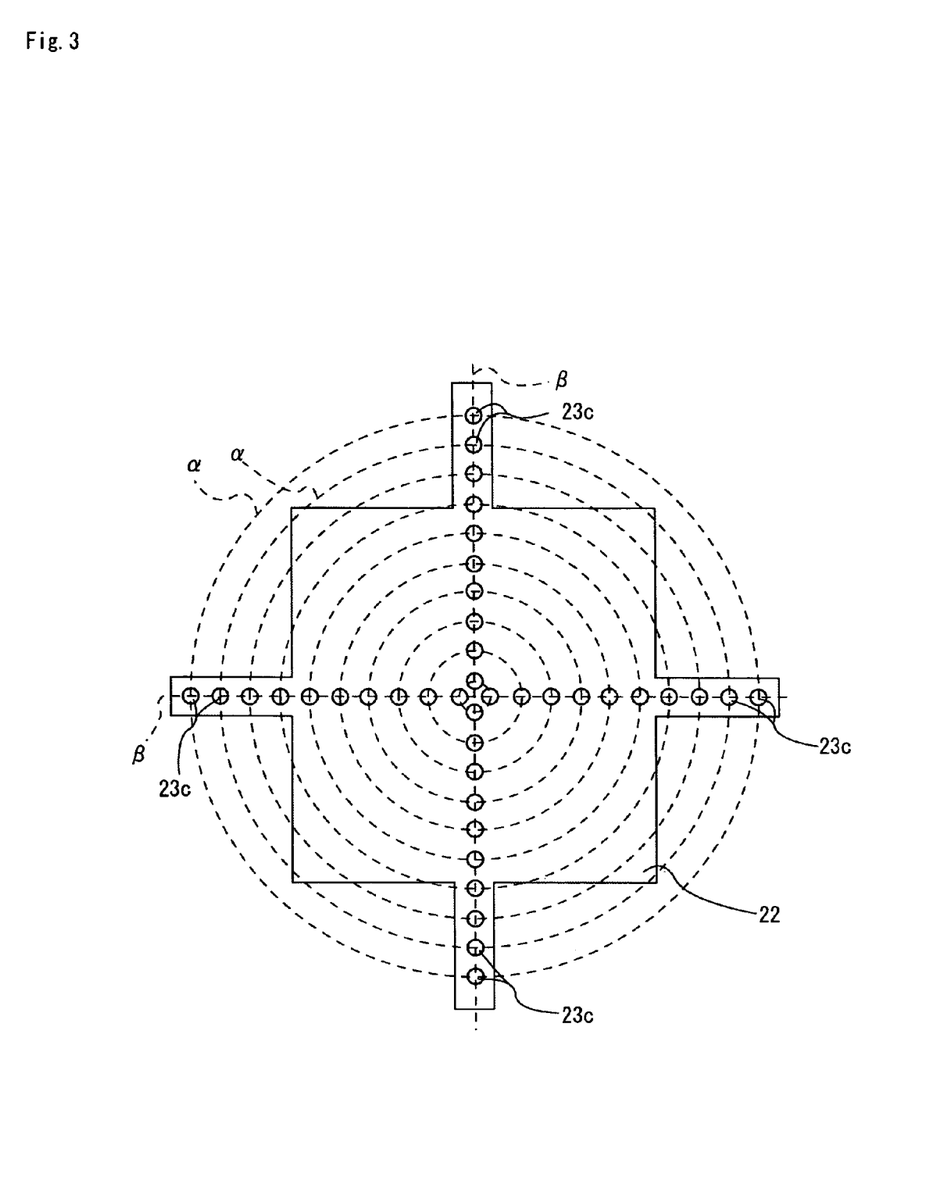
FIG. 3 is a plan view of a sub-reinforcing plate of the test probe card.
Figure 4:
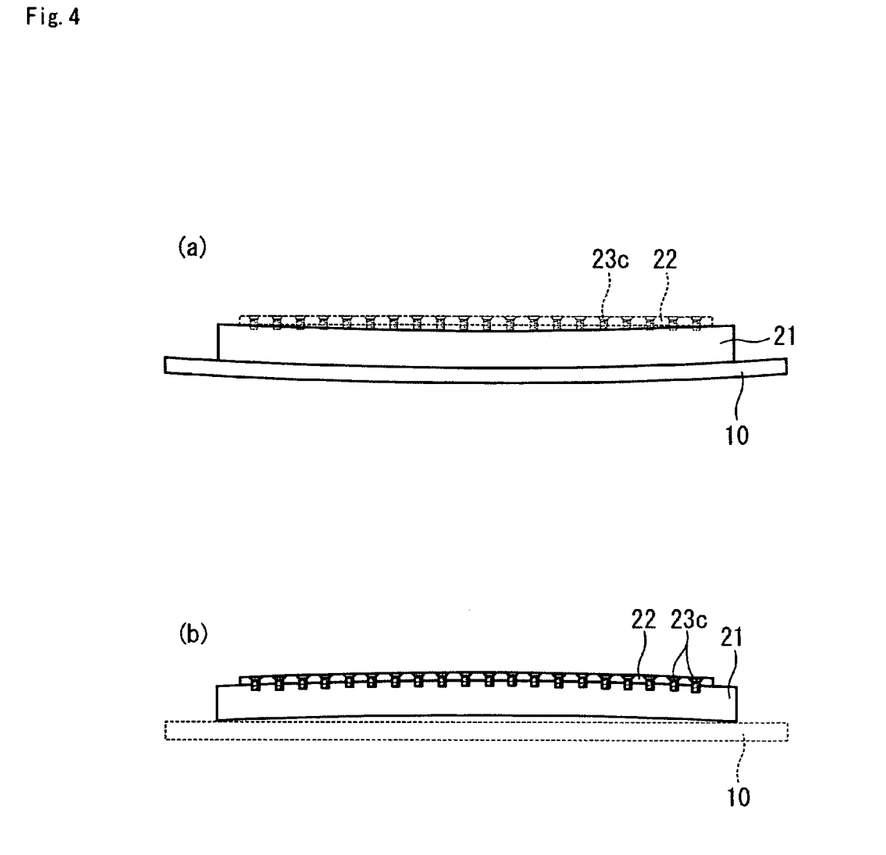
FIG. 4A is a cross-sectional view showing deformation of a main substrate and a main reinforcing plate caused due to the difference in the amount of thermal expansion of the test probe card.
FIG. 4B is a cross-sectional view showing deformation of the sub-reinforcing plate and the main reinforcing plate caused due to the difference in the amount of thermal expansion of the test probe card.
Figure 5:
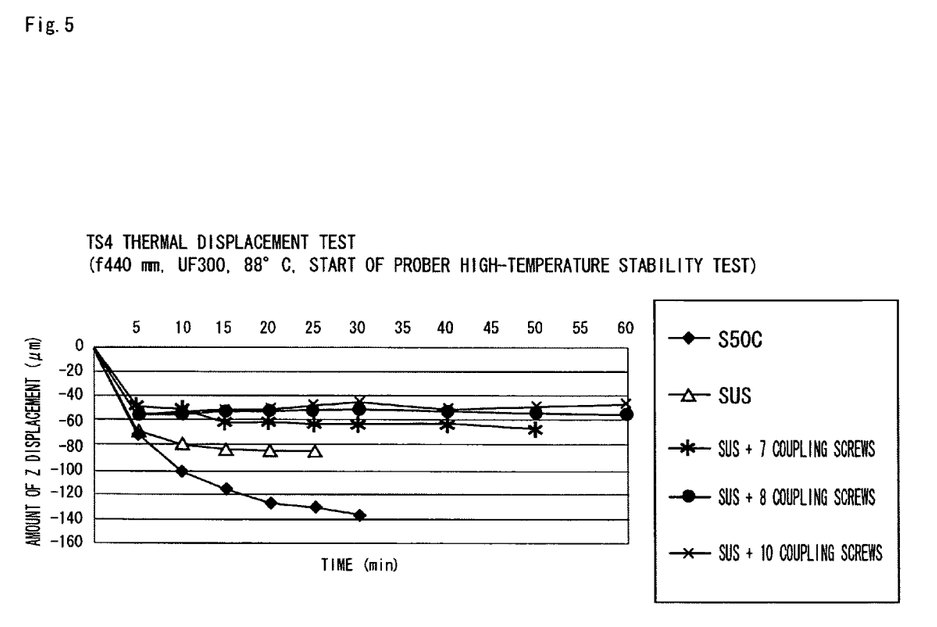
FIG. 5 is a graph showing the amount of displacement in a Z direction of the test probe card with elapse of test time.

Description will be given below of a probe card related to a first embodiment of the present invention with reference to the drawings. FIG. 1 is a schematic sectional view of a probe card related to a first embodiment of the present invention, FIG. 2 is a schematic sectional view of a test probe card related to the first embodiment of the present invention, FIG. 3 is a plan view of a sub-reinforcing plate of the test probe card, FIG. 4A is a cross-sectional view showing deformation of a main substrate and a main reinforcing plate caused due to the difference in the amount of thermal expansion of the test probe card, FIG. 4B is a cross-sectional view showing deformation of the sub-reinforcing plate and the main reinforcing plate caused due to the difference in the amount of thermal expansion of the test probe card, and FIG. 5 is a graph showing the amount of displacement in a Z direction of the test probe card with elapse of test time.

A probe card A shown in FIG. 1 has a main substrate 10, a reinforcing plate 20 attached to the upper surface of the main substrate 10, a probe unit 30 arranged opposite to the lower surface of the main substrate 10, support means 40 attached to the main substrate 10 and elastically supporting the probe unit 30, and a plurality of parallelism adjusting screws 50 (parallelism adjusting means) adjusting parallelism of the probe unit 30 relative to the main substrate 10. Detailed description will be given below of the parts.

The main substrate 10 is a substrate having in its interior wiring patterns not shown in the drawings. An upper electrode (not shown) to be connected electrically to a test measuring instrument such as a tester is provided on the upper surface of the main substrate 10 and a lower electrode (not shown) is provided on the lower surface thereof. The upper electrode is connected electrically to the lower electrode by the wiring pattern.

The probe unit 30 has a base substrate 31 provided with an upper electrode (not shown) and probes (not shown) provided on the lower surface of the base substrate 31. Wiring patterns (not shown) electrically connecting the upper electrode to the probe are provided in the interior of the base substrate 31. The upper electrode of the base substrate 31 is connected electrically to the lower electrode of the main substrate 10 by a substrates connecting member 60 such as a contact pin.

The support means 40 has a first flange portion 41 in a ring shape provided at the outer edge of the base substrate 31 of the probe unit 30, a second flange portion 42 in a ring shape attached to the main substrate 10, and a plurality of springs 43 interposed with a spacing between the first and second flange portions 41 and 42. The plurality of springs 43 are interposed between the first and second flange portions 41 and 42 to elastically support the base substrate 31 of the probe unit 30.

The plurality of parallelism adjusting screws 50 are inserted into a plurality of threaded hole portions 21*a* provided in a main reinforcing plate 21 of the main reinforcing plate 20 and a plurality of threaded hole portions 11 provided in the main substrate 10. The ends of the parallelism adjusting screws 50 are arranged opposite to the upper surface of the outer edge of the base substrate 31 of the probe unit 30 with a predetermined spacing. The parallelism adjusting screws 50 advance through the threaded hole portions 21*a* of the main reinforcing plate 21 and the threaded hole portions 11 of the main substrate 10 to press the outer edge of the base substrate 31 of the probe unit 30. With the pressing, the parallelism of the base substrate 31 relative to the main substrate 10 can be adjusted.

The reinforcing plate 20 has the main reinforcing plate 21 attached to the upper surface of the main substrate 10 in a face-to-face contact state, a sub-reinforcing plate 22 attached to the upper surface of the main reinforcing plate 21 in a face-to-face contact state, and coupling force adjusting means 23 coupling the main reinforcing plate 21 to the sub-reinforcing plate 22 to adjust its coupling force.

The main substrate 10, the main reinforcing plate 21, and the sub-reinforcing plate 22 each are made of a material having a thermal expansion coefficient capable of canceling each other out a warp caused in coupling the main substrate 10 to the main reinforcing plate 21 and a warp caused in coupling the main reinforcing plate 21 to the sub-reinforcing plate 22.

The material of the main substrate 10, the main reinforcing plate 21, and the sub-reinforcing plate 22 is selected according to an environment temperature at which the probe card A is used. A warp caused in coupling the main substrate 10 to the main reinforcing plate 21 (that is, the difference in the amount of thermal expansion) and a warp caused in coupling the main reinforcing plate 21 to the sub-reinforcing plate 22 (that is, the difference in the amount of thermal expansion) are caused to be countered to each other. The two warps cancel each other out to prevent a warp of the probe card A.

The coupling force adjusting means 23 has a plurality of threaded holes 23a provided on the sub-reinforcing plate 22 at the intersections of a plurality of imaginary concentric circles α (see FIG. 3), which is provided with a distance from a center of the probe card A, and a plurality of imaginary straight lines β (see FIG. 3), which is provided radially from the center at an predetermined angle, and a plurality of screw holes provided 23b on the main reinforcing plate 21 at the intersections of the plurality of imaginary concentric circles α and the plurality of imaginary straight lines β, and a plurality of coupling screws 23c threaded into the threaded holes 23a and the screw holes 23b.

As the coupling screw 23c, a countersunk screw in which the outer circumferential surface of a head portion is a tapered surface 23c1 is used. The tapered surface 23c1 of the coupling screw 23c restricts thermal expansion of the sub-reinforcing plate 22 in an X-Y direction.

Specifically, the threaded positions (that is, coupling positions) of the coupling screw 23c into the threaded holes 23a and the screw holes 23b and/or the number of the coupling screws 23c to be threaded is selectively adjusted according to an environment in which the probe card A is used and the material of the main substrate 10, the main reinforcing plate 21, and the sub-reinforcing plate 22, thereby adjusting the coupling force of the main reinforcing plate 21 and the sub-reinforcing plate 22.

By giving a specific example, description will be given below of prevention of deformation of the probe card A by selection of the material of the main substrate 10, the main reinforcing plate 21, and the sub-reinforcing plate 22 and a control method of deformation of the probe card A by the coupling force adjusting means 23.

As shown in FIGS. 2 and 3, a first test probe card used here has a construction slightly different from that of the probe card A. The first test probe card is different from the probe card A in that the probe unit 30 is attached directly to the lower surface of the main substrate 10 and the support means 40 and that the parallelism adjusting screws 50 are not provided. The size and material of the members are as follows.

Sub-reinforcing plate 22: 13 mm in thickness, 200 mm in width, material A7075 (aluminum)

Main reinforcing plate 21: 13 mm in thickness, material to be SUS304 (stainless steel)

Main substrate 10: 6.3 mm in thickness, material to be modified polyimide

Probe unit 30: material to be ceramics

The following two kinds of coupled states between the main reinforcing plate 21 and the sub-reforcing plate 22 are set to the first test probe card. As shown in FIG. 2, in a first coupled state, the coupling screws 23c are threaded into the threaded holes 23b of the main reinforcing plate 21 and the screw holes 23a of the sub reinforcing plate 22 positioned on the concentric circle a having a diameter of 50 mm about the center of the first test probe card. As shown in FIG. 2, in a second coupled state, the coupling screws 23c are threaded into the threaded holes 23b of the main reinforcing plate 21 and the screw holes 23a of the sub reinforcing plate 22 positioned on the concentric circle a having a diameter of 100 mm about the center of the first test probe card.

The first test probe card having such a construction is used to conduct a wafer test under the conditions shown in Tables 1 and 2. Table 1 shows the first test probe card in the first coupled state and Table 2 shows the first test probe card in the second coupled state.

TABLE 1

| Name of member | Temperature of member (° C.) | Temperature difference from room temperature (23° C.) | Material | Thermal expansion coefficient (α) | Amount of thermal expansion (mm) | Difference in thermal expansion (mm) |
|---|---|---|---|---|---|---|
| Wafer | 125 | 102 | Silicon | 3.15E−06 | 0.016 | |
| Probe unit | 100 | 77 | Photoveel 2S | 4.50E−06 | 0.017 | |
| Main substrate | 93 | 70 | Modified polyimide | 1.35E−05 | 0.047 | |
| Main reinforcing plate | 62.5 | 39.5 | SUS304 (stainless steel) | 1.60E−05 | 0.032 | 0.013 |
| Sub-reinforcing plate | 62.5 | 39.5 | A7075 (aluminum) | 2.30E−05 | 0.045 | |

TABLE 2

| Name of member | Temperature of member (° C.) | Temperature difference from room temperature (23° C.) | Material | Thermal expansion coefficient (α) | Amount of thermal expansion (mm) | Difference in thermal expansion (mm) |
|---|---|---|---|---|---|---|
| Wafer | 125 | 102 | Silicon | 3.15E−06 | 0.032 | |
| Probe unit | 100 | 77 | Photoveel 2S | 4.50E−06 | 0.035 | |
| Main substrate | 93 | 70 | Modified polyimide | 1.35E−05 | 0.095 | |

TABLE 2-continued

| Name of member | Temperature of member (° C.) | Temperature difference from room temperature (23° C.) | Material | Thermal expansion coefficient (α) | Amount of thermal expansion (mm) | Difference in thermal expansion (mm) |
|---|---|---|---|---|---|---|
| Main reinforcing plate | 62.5 | 39.5 | SUS304 (stainless steel) | 1.60E−05 | 0.063 | 0.028 |
| Sub-reinforcing plate | 62.5 | 39.5 | A7075 (aluminum) | 2.30E−05 | 0.091 | |

The amount of thermal expansion of the main substrate 10 is compared with the amount of thermal expansion of the main reinforcing plate 21 with reference to the above tables. The amount of thermal expansion of the main substrate 10 is larger than the amount of thermal expansion of the main reinforcing plate 21. Accordingly, as shown in FIG. 4A, the main substrate 10 and the main reinforcing plate 21 are deformed to the main reinforcing plate 21 side. The amount of thermal expansion of the main reinforcing plate 21 is compared with the amount of thermal expansion of the sub-reinforcing plate 22. The amount of thermal expansion of the sub-reinforcing plate 22 is larger than the amount of thermal expansion of the main reinforcing plate 21. Accordingly, as shown in FIG. 4B, the main reinforcing plate 21 and the sub-reinforcing plate 22 are found to be deformed to the main reinforcing plate 21 side. The difference in the amount of thermal expansion of the former is substantially the same as the difference in the amount of thermal expansion of the latter. Deformation of the main substrate 10 and the main reinforcing plate 21 by a bimetal effect and deformation of the main reinforcing plate 21 and the sub-reinforcing plate 22 by a bimetal effect can cancel each other out.

The above test showed that the effect of preventing deformation of the probe card is obtained by forming a main substrate 10, a main reinforcing plate 21, and a sub-reforcing plate 22 with a material having a thermal expansion coefficient capable of canceling warps out caused when coupling the main reinforcing plate 21 to the sub-reforcing plate 22 and coupling the main substrate 10 to the main reinforcing plate 21.

The differences in the amount of thermal expansion between the main reinforcing plate 21 and the sub-reinforcing plate 22 with reference to the above tables are determined in the following manner. In the case of the first coupled state, (the amount of thermal expansion of the sub-reinforcing plate)−(the amount of thermal expansion of the main reinforcing plate)=0.045−0.032=0.013 (mm). In the case of the second coupled state, (the amount of thermal expansion of the sub-reinforcing plate)=(the amount of thermal expansion of the main reinforcing plate)=0.091−0.063=0.028 (mm). Thus, the differences in the amount of thermal expansion between the first and second coupled states is 0.28−0.13=0.15 (mm).

As described above, a difference occurs in the amount of thermal expansion between the main reinforcing plate 21 and the sub-reinforcing plate 22 of the first test probe card due to the difference between the coupled states. Using the difference, the amount of deformation of the probe card can be controlled.

Next, a second test probe card and a conventional probe card are used to conduct the following wafer test. How the amounts of deformation of the second test probe card and the conventional probe card are changed with elapse of test time will be described.

The second test probe card and the conventional probe card have the same construction as that of the first test probe card except that the sub-reinforcing plate 22 is present or absent and the material of the main reinforcing plate 21 is different. The test conditions are the same as those of the above test. As examples of the conventional probe card, the following two kinds of probe cards are prepared, and as working examples of the second test probe card, the following three kinds of probe cards are prepared.

CONVENTIONAL EXAMPLE 1

The absence of the sub-reinforcing plate; material of the main reinforcing plate and be S50C

CONVENTIONAL EXAMPLE 2

The absence of the sub-reinforcing plate; material of the main reinforcing plate and be SUS

EXAMPLE 1

The presence of the sub-reinforcing plate; material of the main reinforcing plate to be SUS; seven coupling screws

EXAMPLE 2

The presence of the sub-reinforcing plate; material of the main reinforcing plate to be SUS; eight coupling screws

EXAMPLE 3

The presence of the sub-reinforcing plate; material of the main reinforcing plate to be SUS; ten coupling screws (As shown in FIG. 3, the number of the coupling screws 23c is a total number of the coupling screws arranged along the imaginary straight lines β from the centers of the respective probe cards. For instance, in the case there are 10 coupling screws 23c, 10 coupling screws 23c are arranged on both sides from the center of the probe card along the imaginary straight lines β, thereby totaling 40 coupling screws 23c.)

This test result is shown in the graph of FIG. 5. The graph indicates conventional example 1 as ♦, conventional example 2 as ∆, example 1 as *, example 2 as •, and example 3 as x. Referring to the graph, the probe cards of conventional example 1 and 2 continue to increase the amount of Z displacement even after an elapse of five minutes after starting the test. In other words, the probe cards continue to deform. The second test probe cards of example 1 to 3 continue to increase the amount of Z displacement as in the probe cards of conventional example 1 and 2 until an elapse of five minutes after starting the test. However, the amount of displacement is small, and the amount of Z displacement is constant after an elapse of five minutes, and then, does not increase. In other words, the deformation of the probe cards is suppressed within a predetermined range.

The amount of displacement of the second test probe cards is smaller than that of the probe cards of conventional examples and is found to be constant after an elapse of five minutes of test time. In this test, as the number of the coupling screws 23c is increased, the amount of displacement of the probe card is found to be smaller.

As described above, the probe card A can prevent deformation of the entire probe card A using the difference in the amount of thermal expansion between the main substrate 10, the main reinforcing plate 21, and the sub-reinforcing plate 22 and can control the amount of displacement of the probe card A by adjusting the coupling force of the main reinforcing plate 21 and the sub-reinforcing plate 22 by the coupling force adjusting means 23. Accordingly, it is possible to suppress variations in the height of the probes due to deformation of the probe card A, and to maintain the most preferable distance between the probes and measurement objectives. As a result, the probe card A can stably measure electric characteristics of a measurement objective.

Figure 6:
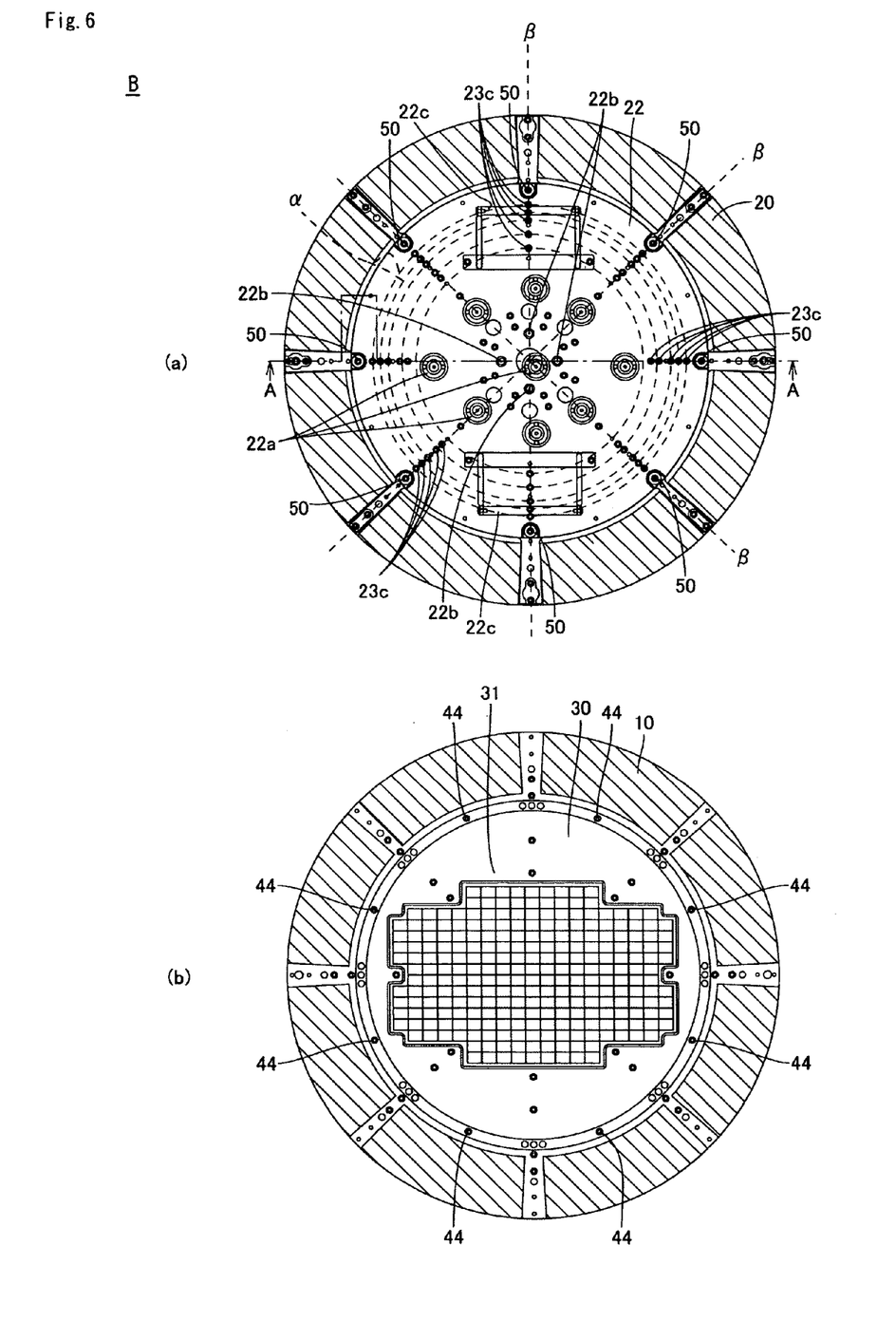
FIG. 6A is a plan view and FIG. 6B is a bottom view.
Figure 8:
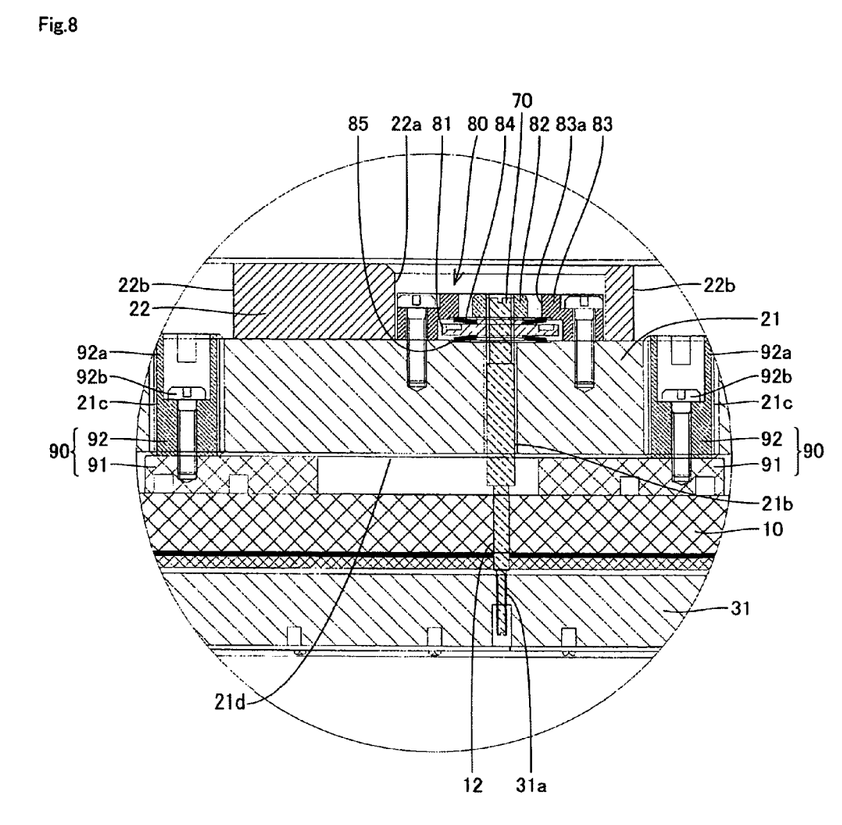
FIG. 8 is an enlarged view of an x portion of FIG. 7 of the probe card.
Figure 9:
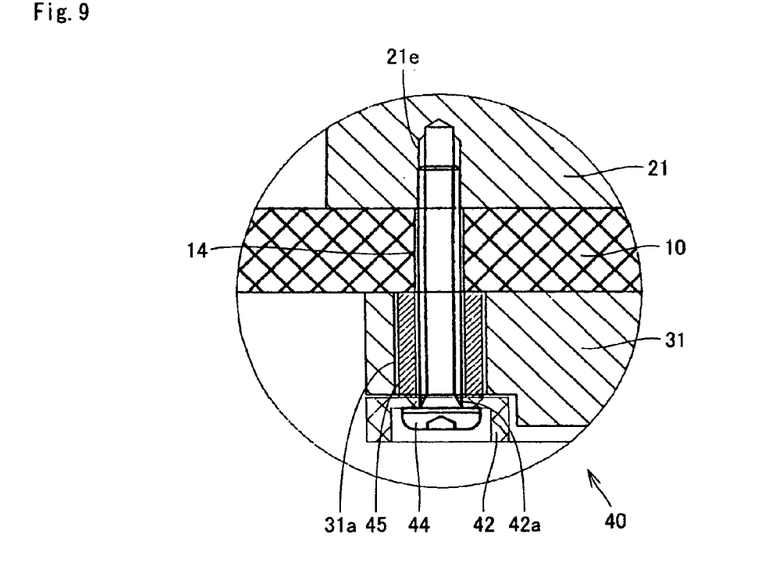
FIG. 9 is an enlarged view of a y portion of FIG. 7 of the probe card.
Figure 10:
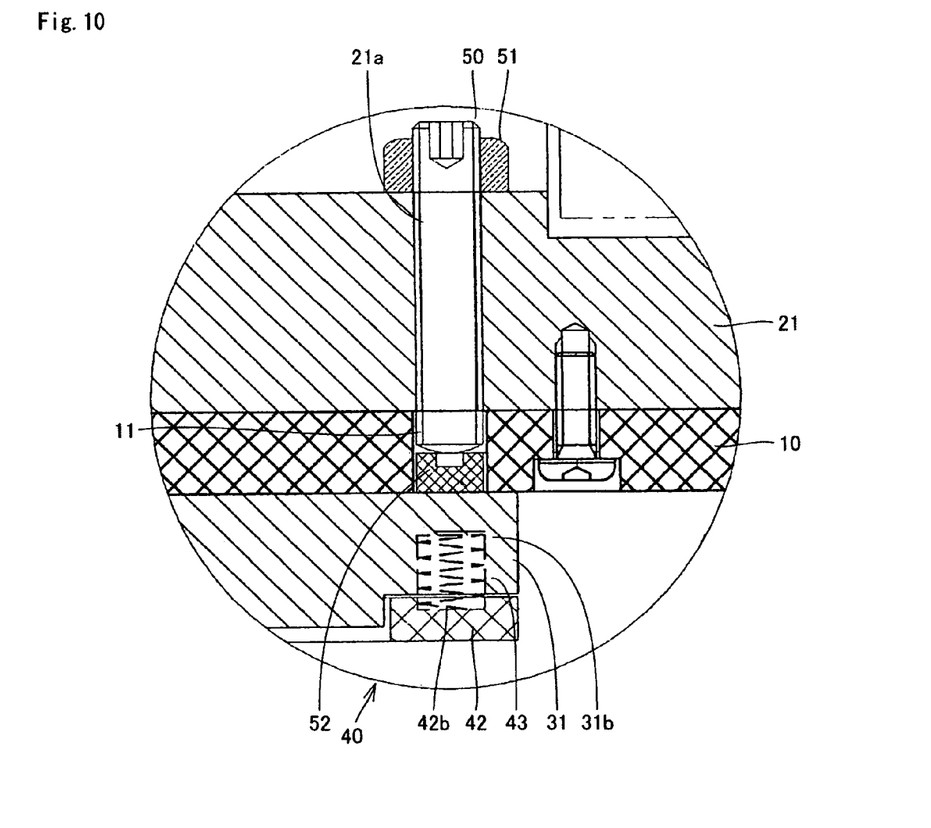
FIG. 10 is an enlarged view of a z portion of FIG. 7 of the probe card.

Description will be given below of a probe card B related to a second embodiment of the present invention with reference to the drawings. FIGS. 6A and 6B are views showing a probe card related to the second embodiment of the present invention, wherein FIG. 6A is a plan view and FIG. 6B is a bottom view, FIG. 7 is a cross-sectional view taken along line A-A of FIG. 6 of the probe card, FIG. 8 is an enlarged view of an x portion of FIG. 7 of the probe card, FIG. 9 is an enlarged view of a y portion of FIG. 7 of the probe card, and FIG. 10 is an enlarged view of a z portion of FIG. 7 of the probe card.

Figure 7:
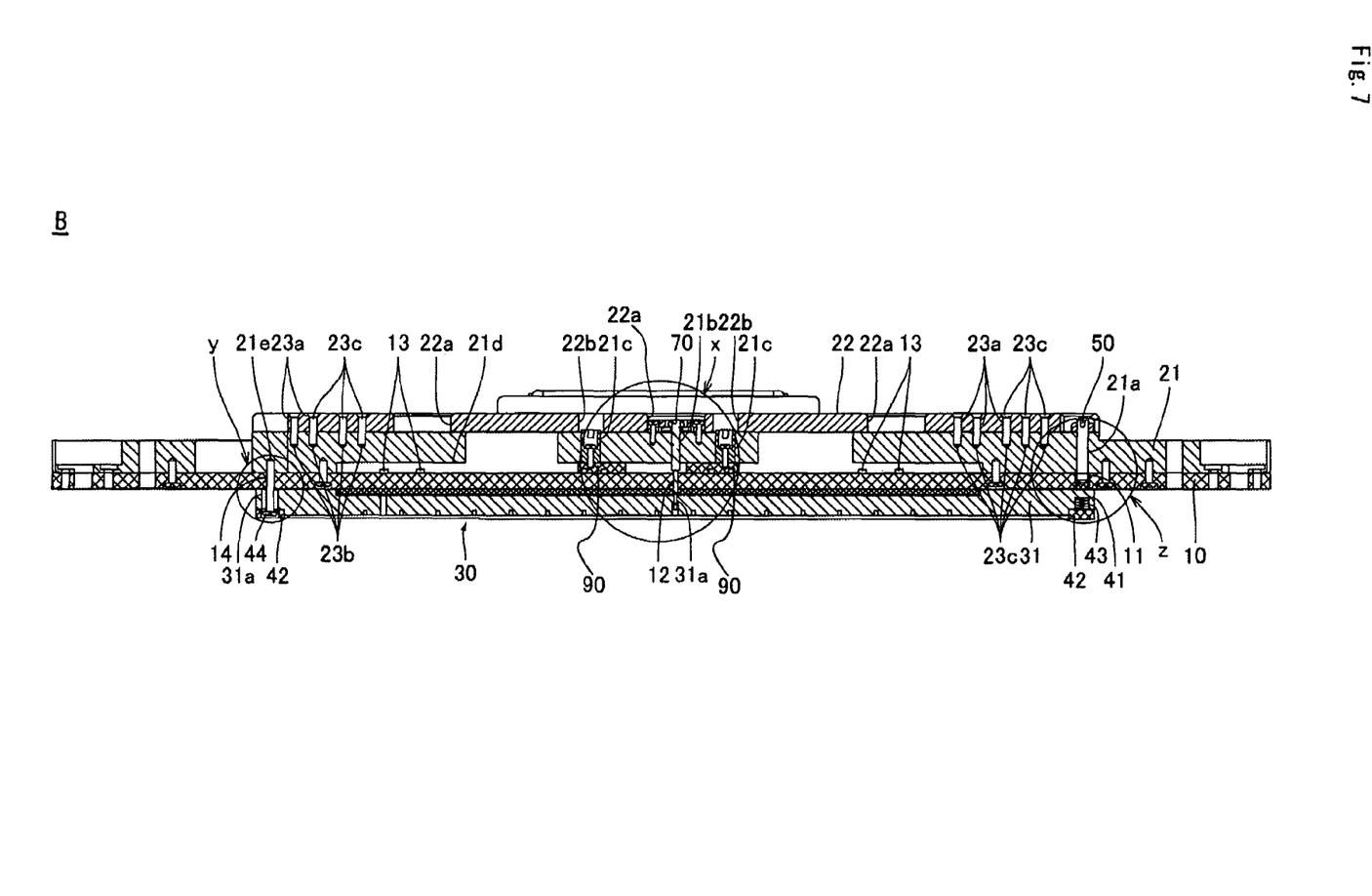
FIG. 7 is a cross-sectional view taken along line A-A of FIG. 6 of the probe card.

The probe card B shown in FIGS. 6 and 7 is substantially the same as the probe card A. The probe card B is different from that the probe card A in that a first reinforcing member 70 is suspended between the main reinforcing plate 21 of the reinforcing plate 20 and the base substrate 31 of the probe unit 30, that a concave portion 21d is provided in the lower surface of the main reinforcing plate 21, and that the parallelism adjusting screw 50 is arranged above the spring 43 of the support means 40. Detailed description will be given below of the different points and description of the duplicated portions is not given.

As shown in FIG. 7, the main substrate 10 has, in a position slightly shifted from the center of the probe card B, an insertion hole 12 into which the first reinforcing member 70 is inserted.

Circuit elements 13 connected electrically to the wiring patterns not shown in the interior of the main substrate 10 are provided on the upper surface of the main substrate 10. The circuit element 13 is an element necessary to conduct electric measurement of a measurement objective with the probe and, for instance, includes a capacitor functioning as a so-called pass capacitor and a circuit element functioning as a BOST (build out self test) circuit assisting a test (that is, measurement of electric characteristics of the measurement objective B). The capacitor plays a role to improve high frequency characteristics. The circuit element 13 functioning as a BOST circuit plays a role that alters according to contents of a test on the measurement objective.

As shown in FIGS. 7 and 8, the main reinforcing plate 21 has a position shifted from the center of the probe card B an insertion hole 21b into which the first reinforcing member 70 is inserted. Four mounting holes 21c (two are shown) are provided around the insertion hole 21b of the main reinforcing plate 21 about the center of the probe card B at a 90° pitch. The mounting hole 21c is a hole for mounting a second reinforcing member 90 described later.

As shown in FIG. 7, the concave portion 21d for housing the circuit elements 13 is provided in the lower surface of the main reinforcing plate 21.

As shown in FIGS. 6 and 7, the sub-reinforcing plate 22 is provided with a plurality of first through-holes 22a in a position slightly shifted from the center of the probe card B and around the position. The fixing member 83 of buffer means 80 described later is housed in the first through-hole 22a. Here, a fixing member 63 fixing the first reinforcing member 70 is housed only in the first through-hole 22a provided in a position shifted from the center of the sub-reinforcing plate 22.

Four second through-holes 22b are provided in the center portion of the sub-reinforcing plate 22 about the center of the probe card B at a 90° pitch. The second through-hole 22b is a hole for exposing the mounting hole 21c of the main reinforcing plate 21. A pair of handles 22c for easily carrying the probe card are provided on the upper surface of the sub-reinforcing plate 22.

As shown in FIGS. 6 and 7, the coupling force adjusting means 23 is the same as the probe card A except that the position of the imaginary concentric circle α and the predetermined angle of the imaginary straight line β are different. The disposed positions (that is, coupling positions) of the plurality of threaded holes 23a of the sub-reinforcing plate 22 and the plurality of screw holes 23b of the main reinforcing plate 21 are different from the disposed positions of the plurality of threaded holes 23a of the sub-reinforcing plate 22 and the plurality of screw holes 23b of the main reinforcing plate 21 of the probe card A.

As shown in FIGS. 7 and 8, the first reinforcing member 70 is a rod inserted into the insertion hole 21b of the main reinforcing plate 21 and the insertion hole 12 of the main substrate 10 and has one end threaded into a threaded hole 31a of the base substrate 31 of the probe unit 30. The other end of the first reinforcing member 70 projects out from the insertion hole 21b of the main reinforcing plate 21 to be exposed from the first through-hole 22a of the sub-reinforcing plate 22.

As shown in FIG. 8, the buffer means 80 has a threading member 81 threaded into the exposed other end of the first reinforcing member 70 one on the other, a fastening member 82 having an outer diameter smaller than that of the threading member 81, a fixing member 83 covering the outer edge of the threading member 81, a first elastic member 84 provided between the threading member 81 and the fixing member 83, and a second elastic member 85 interposed between the threading member 81 and the main reinforcing plate 21.

The fixing member 83 is a cylindrical member housed in the first through-hole 22a in a position shifted from the center of the sub-reinforcing plate 22 and screwed into the upper surface of the main reinforcing plate 21. The fixing member 83 has a convex hole portion 83a in section. The step portion of the hole portion 83a covers the outer edge of the threading member 81.

The first elastic member 84 is a ring-like flat head screw having an outer diameter larger than that of the fastening member 82 and an inner edge and an outer edge having different height positions. The first elastic member 84 penetrates through the first reinforcing member 70 to be attached between the threading member 81 and the fastening member 82. In this state, the inner edge of the first elastic member 84 is brought into contact with the upper surface of the threading member 81 and the outer edge thereof is brought into contact with the step portion of the hole portion 83a of the fixing member 83. The threading member 81 is moved upward with the first elastic member 84. The first elastic member 84 is elastically deformed so that the inner edge and the outer edge have the same height to buffer a force acting on the main reinforcing plate 21 through the first reinforcing member 70.

The second elastic member 85 is a flat head screw which is the same as the first elastic member 84. The second elastic member 85 penetrates through the first reinforcing member 70 to be positioned on the lower side of the threading member 81. That is, the second elastic member 85 is arranged between the threading member 81 and the main reinforcing plate 21. In this state, when the fastening member 82 and the threading member 81 are fastened, the second elastic member 85 is elastically deformed so that the inner edge and the outer edge have the same height to exert the threading member 81 and the main reinforcing plate 21 in a direction in which they are moved away from each other. Thus, loosening of the threading member 81 and the fastening member 82 can be prevented.

As shown in FIG. 8, the second reinforcing member 90 has four support portions 91 (two are shown) provided between the upper surface of the main substrate 10 and the bottom of the concave portion 21 of the main reinforcing plate 21, and four fixing portions 92 (two are shown) inserted into the four mounting holes 21c of the main reinforcing plate 21 and screwing the four support portions 91. The support portion 91 is adhered to the upper surface of the main substrate 10 or screwed with a very small screw. The fixing portion 92 has a nut 92a and a screw 92b threaded into the nut 92a and the support portion 91. The support portion 91 is interposed between the upper surface of the main substrate 10 and the bottom surface of the concave portion 21d of the main reinforcing plate 21 to provide the concave portion 21d in the main reinforcing plate 20, thereby preventing the strength from being lowered.

As shown in FIGS. 7 and 9, the second flange portion 42 of the support means 40 is attached to the main reinforcing plate 21 with a flange fixing screw 44 to be opposite the lower surface of the outer edge of the base substrate 31. The flange fixing screw 44 sequentially penetrates through a hole portion 42a provided in the second flange portion 42, the hole portion 31a provided at the outer edge of the base substrate 31 of the probe unit 30, and a hole portion 14 provided in the main substrate 10 to be threaded into the hole portion 21e of the main reinforcing plate 21. A spacer 45 higher than the hole portion 31a of the base substrate 31 is interposed between the lower surface of the outer edge of the base substrate 31 and the upper surface of the second flange portion 42 to maintain the spacing between both at a predetermined pitch.

As shown in FIGS. 7 and 10, the springs 43 are respectively housed between a plurality of concave portions 31b provided in the lower surface of the base substrate 31 at each predetermined pitch and the concave portions 42b provided in the upper surface of the second flange portion 42 at each predetermined pitch.

As shown in FIGS. 7 and 10, the parallelism adjusting screws 50 are inserted into the plurality of threaded hole portions 21a of the main reinforcing plate 21 and the plurality of threaded hole portions 11 of the main substrate 10 and have ends arranged above the concave portion 31b of the base substrate 31 of the probe unit 30 across a spacer 52. A nut 50 is threaded into the rear end of the parallelism adjusting screw 50. The parallelism adjusting screw 50 advances through the threaded hole portion 21a and the threaded hole portion 11 to press the outer edge of the base substrate 31 via the spacer 52. With the pressing, the springs 43 immediately below the pressed portion of the base substrate 31 are expanded or contracted to adjust the parallelism of the base substrate 31. The portion immediately above the spring 43 at the outer edge of the base substrate 31 is pressed by the parallelism adjusting screw 50 to finely adjust the parallelism of the base substrate 31.

In the probe card B of this kind, the difference in the amount of thermal expansion between the main substrate 10, the main reinforcing plate 21, and the sub-reinforcing plate 22 is used to prevent deformation of the entire probe card A. The coupling force adjusting means 23 adjusts the coupling force of the main reinforcing plate 21 and the sub-reinforcing plate 22 to control the amount of deformation of the probe card A. The probe card B can obtain the same effect as that of the probe card A.

The first reinforcing member 70 is attached to the center portion of the base substrate 31 of the probe unit 30 and the center portion of the main reinforcing plate 21. When a probe is brought into contact with a measurement objective, the first reinforcing member 70 can transmit a force acting on the base substrate 31 through the probe to the main reinforcing plate 21 and distribute it. The force can be absorbed by the buffer means 80 attached to the first reinforcing member 70. Thus, because the center portion of the probe card B cannot be distorted by the force at contact, it is possible to provide the probe card B suitable for up sizing.

The probe card adjusts the coupling force of the sub-reinforcing plate and the main reinforcing plate to adjust displacement of the probe card. As a method of adjusting the coupling force, the number of flat head screws or the pitch thereof is changed or the coupling screws 23c can be arranged densely in the center portion and be arranged non-densely outside. The above embodiments are just the examples of the present invention, and it is needless to say that the coupling force can be adjusted by various methods.

It is also possible to use pins as the coupling screws 23c. When using the pins, the plurality of threaded holes 23a of the sub-reinforcing plate 22 and the plurality of screw holes 23b of the main reinforcing plate 21 are plain holes.

As far as the main substrate 10, the main reinforcing plate 21, and the sub-reinforcing plate 22 each are made of a material having a thermal expansion coefficient capable of canceling each other out a warp caused in coupling the main substrate with the main reinforcing plate and a warp caused in coupling the main reinforcing plate with the sub-reinforcing plate, any material may be used. In the above embodiments, deformation of the main substrate and the main reinforcing plate to the main reinforcing plate side by a bimetal effect due to thermal expansion and deformation of the main reinforcing plate and the sub-reinforcing plate to the main reinforcing plate side by a bimetal effect due to thermal expansion cancel each other out to prevent a probe card from being deformed. The present invention is not limited thereto. A material having a thermal expansion coefficient in which the amount of thermal expansion of the main substrate is smaller than the amount of thermal expansion of the main reinforcing plate at a test and the amount of thermal expansion of the sub-reinforcing plate is smaller than the amount of thermal expansion of the main reinforcing plate can be selected as the material of each planar member. In this case, deformation of the main substrate and the main reinforcing plate to the main substrate side by a bimetal effect due to thermal expansion and deformation of the main reinforcing plate and the sub-reinforcing plate to the sub-reinforcing plate side by a bimetal effect due to thermal expansion cancel each other out to prevent a probe card from being deformed. As well as deformation by a bimetal effect due to thermal expansion, deformation by a bimetal effect due to thermal shrinkage of each planar member can obtain the same effect. The material of each planar member is selected in consideration of a temperature of each planar member at a test and a thermal expansion coefficient. A measurement objective can be stably measured in an environment at low temperature as well as at high temperature.

What is claimed is:

1. A probe card comprising:
    a main substrate;
    a main reinforcing plate attached to the main substrate;
    a sub-reinforcing plate attached to the main reinforcing plate, and
    a coupling force adjusting means for coupling the main reinforcing plate with the sub-reinforcing plate at a plurality of coupling positions that are intersections of a plurality of imaginary concentric circles provided at different distances from a center of the probe card, and a plurality of imaginary straight lines provided radially from the center at a predetermined angle, so as to prevent deformation of the main reinforcing plate and the sub-reinforcing plate due to the difference in the amount of thermal expansion or thermal shrinkage,
    wherein the coupling force adjusting means comprises:
    a plurality of threaded holes of the main reinforcing plate provided at the plurality of coupling positions;
    a plurality of threaded holes of the sub-reinforcing plate provided at the plurality of coupling positions; and
    a plurality of coupling screws for selectively threading into the respective screw holes and threaded holes, the coupling screws being countersunk screws whose outer circumferential surfaces of head portions are taped.

2. A probe card comprising:
    a main substrate;
    a main reinforcing plate attached to the main substrate; and
    a sub-reinforcing plate attached to the main reinforcing plate, wherein each of the main substrate, the main reinforcing plate, and the sub-reinforcing plate is made of a material having a thermal expansion coefficient at which warping caused in coupling the main substrate with the main reinforcing plate and warping caused in coupling the main reinforcing plate with the sub-reinforcing plate cancel each other.

3. The probe card according to claim 2, further comprising:
    a coupling force adjusting means for coupling the main reinforcing plate with the sub-reinforcing plate at a plurality of coupling positions that are intersections of a plurality of imaginary concentric circles provided at different distances from a center of the probe card, and a plurality of imaginary straight lines provided radially from the center at an predetermined angle, the coupling force adjusting means being adapted to selectively set the plurality of coupling positions.

4. The probe card according to claim 3, wherein the coupling force adjusting means is provided with a plurality of screw holes of the main reinforcing plate provided at the plurality of coupling positions, a plurality of threaded holes of the sub-reinforcing plate provided at the plurality of coupling positions, and a plurality of coupling screws threaded into the respective screw holes and threaded holes.

5. The probe card according to claim 4, wherein each coupling screw is a countersunk screw whose outer circumferential surface of a head portion is a tapered surface.

* * * * *